United States Patent
Ratnakumar et al.

(10) Patent No.: US 8,242,581 B1
(45) Date of Patent: Aug. 14, 2012

(54) MIXED-GATE METAL-OXIDE-SEMICONDUCTOR VARACTORS

(75) Inventors: Albert Ratnakumar, San Jose, CA (US); Wilson Wong, San Francisco, CA (US); Jun Liu, Santa Clara, CA (US); Qi Xiang, San Jose, CA (US); Jeffrey Xiaoqi Tung, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 215 days.

(21) Appl. No.: 12/324,793

(22) Filed: Nov. 26, 2008

(51) Int. Cl.
  *H01L 29/93* (2006.01)
(52) U.S. Cl. . 257/595; 257/312; 257/327; 257/E21.364; 257/E29.344
(58) Field of Classification Search .......... 257/312, 257/327, 331, 350, 388, 407, 412, 595, E21.364, 257/E27.049, E29.344, E29.345, E29.364
See application file for complete search history.

(56) References Cited

U.S. PATENT DOCUMENTS

| | | | |
|---|---|---|---|
| 6,630,720 B1 * | 10/2003 | Maszara et al. | 257/407 |
| 6,674,116 B1 * | 1/2004 | Cao | 257/312 |
| 7,368,775 B2 * | 5/2008 | Huang et al. | 257/296 |
| 7,545,007 B2 * | 6/2009 | Greer et al. | 257/386 |
| 2009/0057742 A1 * | 3/2009 | Lee et al. | 257/312 |

OTHER PUBLICATIONS

Zhou et al. "A Novel Hetero-Material Gate (HMG) MOSFET for Deep-Submicron ULSI Technology", IEEE Transactions on Electron Devices, vol. 45, No. 12, Dec. 1998.

* cited by examiner

*Primary Examiner* — Eduardo A Rodela
(74) *Attorney, Agent, or Firm* — Treyz Law Group; G. Victor Treyz; Jason Tsai

(57) ABSTRACT

Mixed gate varactors are provided. The mixed gate varactors may include a semiconductor region of a given doping type. A first terminal for the varactor may be formed from a gate structure on the semiconductor region. A second terminal for the varactor may be formed from a heavily doped region in the semiconductor region that has the same doping type as the given doping type. A third terminal for the varactor may be formed from a heavily doped region in the semiconductor region that has a different doping type than the given doping type. The gate structure may include multiple gate conductors on a gate insulator. The gate insulator may be a high-K dielectric. The gate conductors may be metals or other materials that have different work functions. A conductive layer such as a layer of polysilicon may electrically connect the first and second gate conductors.

18 Claims, 9 Drawing Sheets

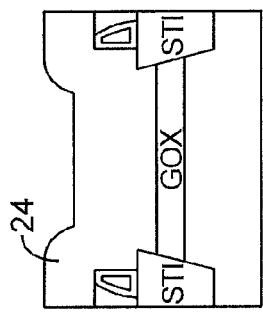
FIG. 7
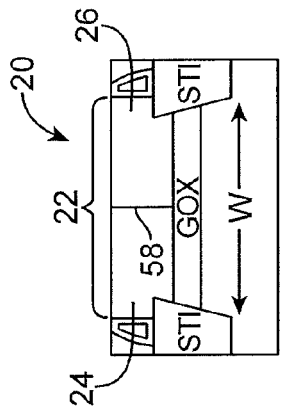
FIG. 11
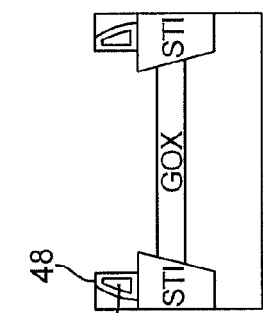
FIG. 6
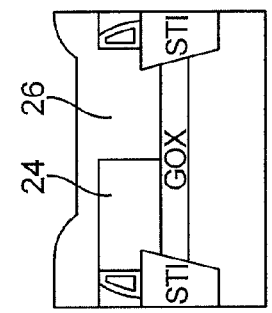
FIG. 10
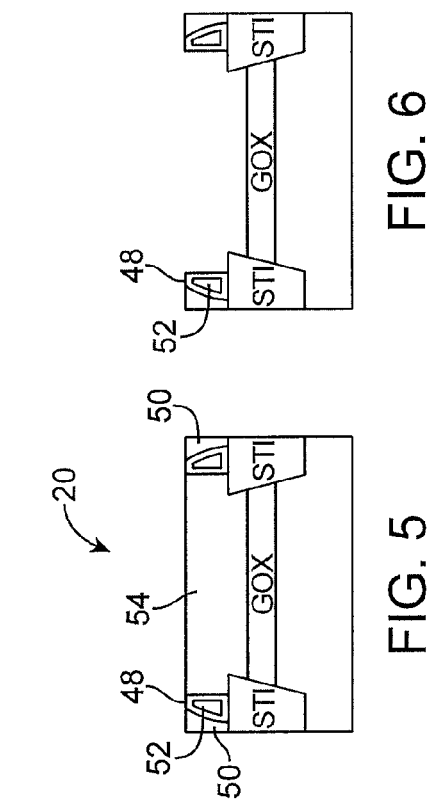
FIG. 5
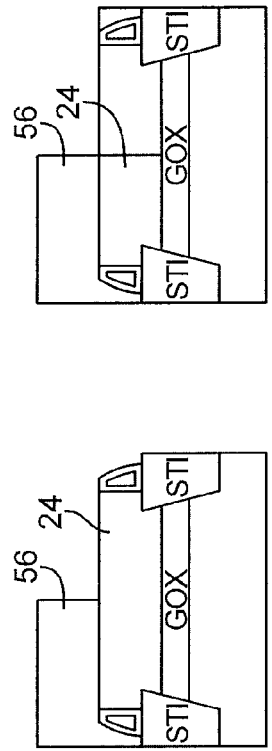
FIG. 9
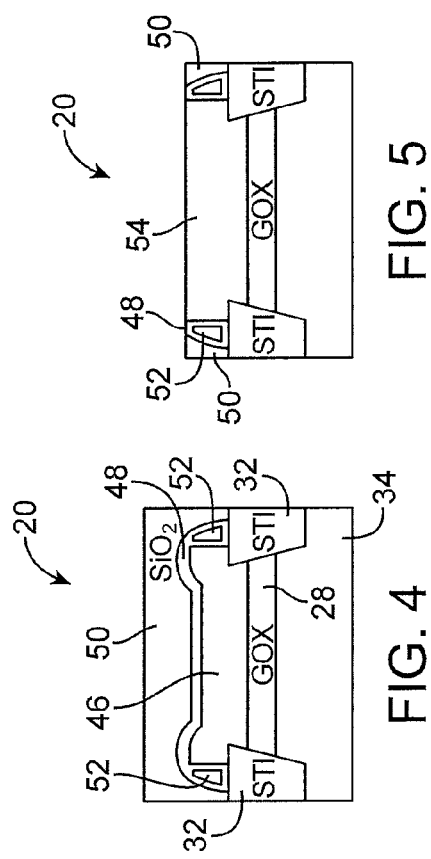
FIG. 4
FIG. 8

MIXED-GATE METAL-OXIDE-SEMICONDUCTOR VARACTORS

BACKGROUND

This invention relates to varactors, and more particularly, to metal-oxide-semiconductor varactors with multipart gate structures.

A varactor is a controllable capacitor. Varactors are widely used in high frequency integrated circuits. For example, varactors are commonly used as voltage-controlled tuning components in analog circuits such as filters and voltage-controlled oscillators. Voltage-controlled oscillators are used in circuits such as phase-locked loops. Phase-locked loops, in turn, are often used in circuits such as clock and data recovery circuits.

Successful operation of these circuits depends on accurate and predictable varactor performance. High performance varactors are characterized by high quality factors ("Q"), a wide and gradual voltage-controlled capacitance tuning range, and good linearity.

Shortcomings in these performance attributes can adversely affect circuit performance. For example, non-linear and abrupt varactor tuning characteristics can adversely affect noise performance and circuit stability.

Varactors have been developed that are based on pn junction capacitance ("junction varactors") and modified metal-oxide-semiconductor (MOS) transistor structures ("MOS varactors"). MOS varactors that are operated in accumulation mode are sometimes referred to as accumulation mode metal-oxide-semiconductor (A-MOS) varactors. MOS varactors that are operated in inversion mode are sometimes referred to as inversion mode metal-oxide-semiconductor (I-MOS) varactors.

Junction varactors exhibit gradual changes of capacitance with change in tuning voltage. This gradual CV slope characteristic is generally beneficial for circuit performance. Nevertheless, junction varactors exhibit poor quality factors Q and poor tuning ranges.

Because of these issues, many modern circuit designs use MOS varactor structures. Both A-MOS and I-MOS varactors exhibit satisfactory tuning ranges and quality factors. The quality factor of A-MOS devices tends to be superior to that of I-MOS devices. Moreover, I-MOS devices tend to exhibit particularly steep CV slopes. A-MOS devices are therefore often preferred over I-MOS devices.

A-MOS varactors tend to exhibit superior quality factors and tuning ranges to those available from junction varactors. Nevertheless, A-MOS varactors exhibit steeper CV slopes than junction varactors. The relatively steep slope of A-MOS varactors has made conventional A-MOS varactors unappealing in some design contexts. As a result, analog circuit designers sometimes prefer to use junction varactors, despite their poorer quality factor and tuning range characteristics. These constraints sometimes force designers to make undesirable design compromises.

It would therefore be desirable to be able to provide improved varactors for integrated circuits.

SUMMARY

Mixed gate varactors are provided. The mixed gate varactors may be formed from a semiconductor region such as a region of silicon of a given doping type. A terminal may be formed for the varactor using a heavily doped region in the semiconductor region that has the same doping type as the given doping type. Another terminal for the varactor may be formed using a heavily doped region in the semiconductor that has a different (opposite) doping type from the given doping type. For example, if the semiconductor region is formed from n-type silicon, varactor terminals may be formed using a heavily doped n-type region and a heavily doped p-type region in the n-type silicon.

A gate insulating layer may be formed on the semiconductor region. The gate insulating layer may be formed from a material such as silicon dioxide. The gate insulating layer may also be formed from a material with a higher dielectric constant than silicon dioxide (i.e., a so-called high-K dielectric).

A gate conductor structure may be formed on the gate insulating layer. The gate conductor structure may form another terminal for the varactor.

The capacitance developed by a mixed gate varactor across first and second varactor terminals may be controlled by adjusting a bias voltage applied to a third varactor terminal. The mixed gate varactor may exhibit good linearity and a gradual slope in its capacitance versus voltage characteristic. This may enhance circuit performance for circuits in which the mixed gate varactor is used.

The gate conductor structure may include two or more gate conductors. At least two of the gate conductors have different work functions. The gate conductors may, for example, be formed from first and second metals with different work functions. The gate conductor structure may have first and second lateral dimensions along the surface of the semiconductor region and the gate insulating layer. The first lateral dimension may represent a gate width. The second lateral dimension may represent a gate length. The gate width may be greater than the gate length.

The gate conductors may be arranged along either the first or second lateral dimension. For example, for example, first and second gate conductors may be arranged along the longer lateral dimension (i.e., the gate width). If desired, additional gate conductors may be provided in the same gate structure.

Within a given gate structure, the first and second gate conductors may be connected at an interface. One or more additional layers of conductive material may be provided in the gate conductor structure. For example, a conductive layer such as a layer of polysilicon may be formed on top of the first and second gate conductors. The polysilicon layer may be formed directly on the surface of the first gate conductor. Some of the polysilicon layer may also be formed directly on the surface of the second gate conductor layer or may be formed on top of a portion of the first gate conductor that in turn overlaps the second gate conductor.

Further features of the invention, its nature and various advantages will be more apparent from the accompanying drawings and the following detailed description of the preferred embodiments.

BRIEF DESCRIPTION OF THE DRAWINGS

FIGS. 4, 5, 6, 7, 8, 9, 10, and 11 are cross-sectional diagrams showing an illustrative method for forming a varactor of the type shown in FIG. 2 in accordance with an embodiment of the present invention.

DETAILED DESCRIPTION

The present invention relates to voltage-controlled variable capacitors. Variable capacitors, which are often referred to as varactors, are commonly formed from pn junction structures and metal-oxide-semiconductor (MOS) structures on integrated circuits. Junction varactors and MOS varactors are used in a wide variety of applications and may be formed on programmable logic device integrated circuits, communications devices, circuits with analog and digital circuitry, application-specific-integrated circuits, and other integrated circuits.

Varactors in accordance with embodiments of the present invention may have gate structures that are formed from more than one type of material (i.e., "mixed gates" or "multipart gates"). The gate structures may, for example, be formed from first and second gate metals having respective first and second work functions. Varactors such as these may exhibit gradual and linear changes in capacitance C with applied tuning voltage V (i.e., gradual CV curve slopes). This behavior may help enhance performance when the varactors are used in a circuit on an integrated circuit.

The semiconductor fabrication processes that are used in forming the varactors with mixed gates may involve the same types of process steps that are used to form complementary metal-oxide-semiconductor (CMOS) transistor devices. CMOS chips are widely used in the electronics industry. Although the steps that make up a CMOS fabrication process evolve over time as technology improves, a semiconductor fabrication facility ("fab") generally has only one or a few available qualified process flows that can be used to form CMOS integrated circuits. Because a fab must maintain strict controls on the manufacturing processes used during fabrication, it is generally not possible to fabricate a mass-produced CMOS integrated circuit unless the circuit can be formed using one of the qualified process flows. The ability to use available CMOS process flows to form mixed gate varactors may therefore enhance manufacturability.

Figure 1:
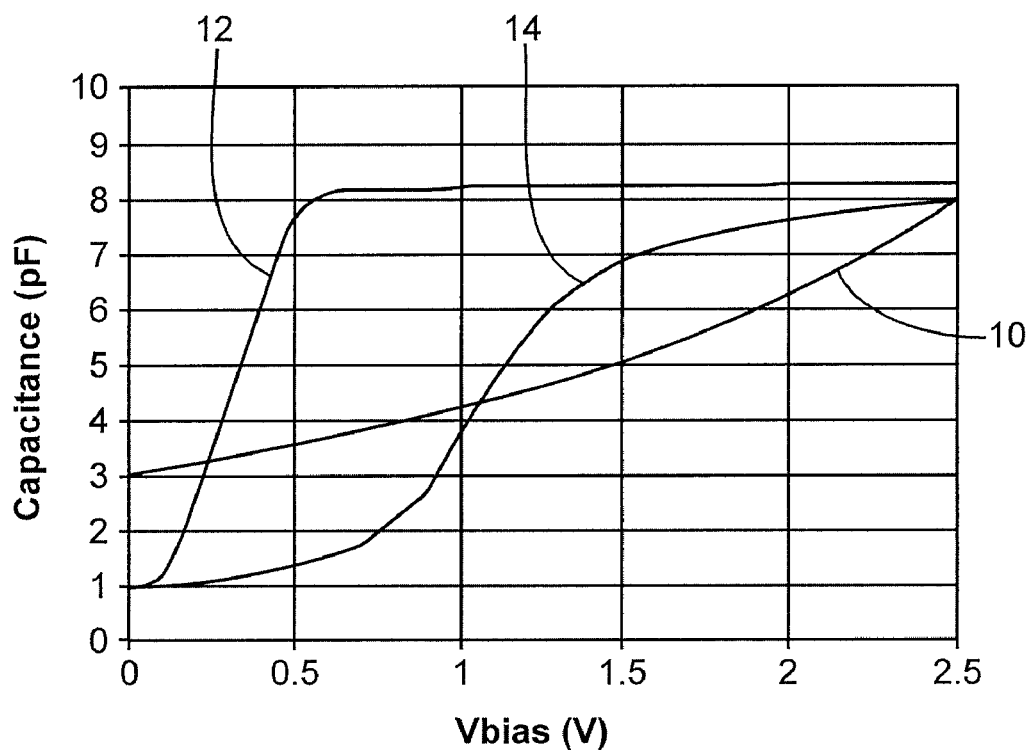
FIG. 1 is a graph comparing the performance of three different conventional types of varactor.

A graph showing the capacitance versus tuning voltage (CV) characteristics of three conventional varactors is shown in FIG. 1. Varactors have three terminals. A capacitance C is developed across first and second terminals (e.g., the gate and body terminals in an MOS varactor). A third terminal (e.g., a terminal connected to shorted source and drain terminals) receives a control voltage, sometimes referred to as Vbias. The magnitude of the capacitance C across the first and second terminals is controlled by controlling the magnitude of the control voltage Vbias.

The traces in the graph of FIG. 1 show the dependence on varactor capacitance versus bias voltage for a junction varactor (trace 10), an inversion mode MOS (I-MOS) varactor (trace 12), and an accumulation mode MOS (A-MOS) varactor (trace 14). As trace 10 of FIG. 1 demonstrates, typical junction varactors exhibit highly desirable gradual CV curve slopes. Nevertheless, because of poor quality factors Q and poor tuning ranges, junction varactors are not acceptable in many circuit designs.

I-MOS varactors generally exhibit better quality factors Q and tuning ranges, but are characterized by steep CV curves, as shown by trace 12.

As shown by trace 14, a typical A-MOS varactor may be characterized by a CV curve slope that is less steep than the slope of the CV curve for the I-MOS varactor of trace 12. Nevertheless, the slope of the A-MOS CV curve may still be undesirably high for some circuit applications.

Figure 2A:
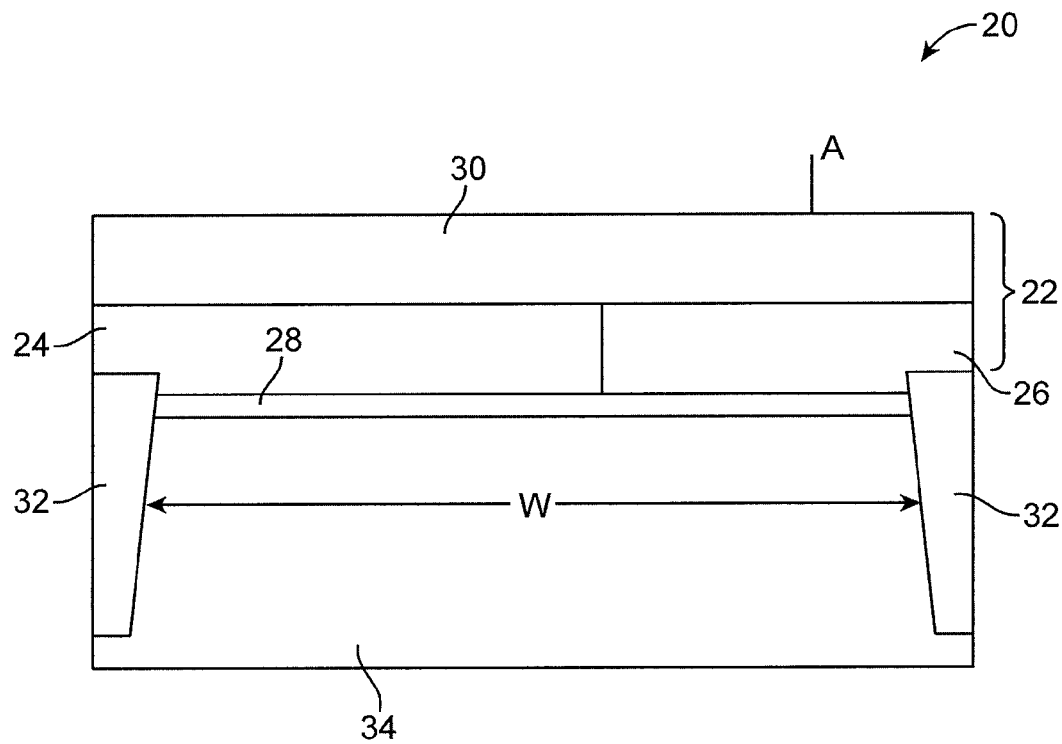
FIGS. 2A and 2B are cross-sectional views of a mixed gate metal-oxide-semiconductor (MOS) varactor in accordance with an embodiment of the present invention.
Figure 2B:
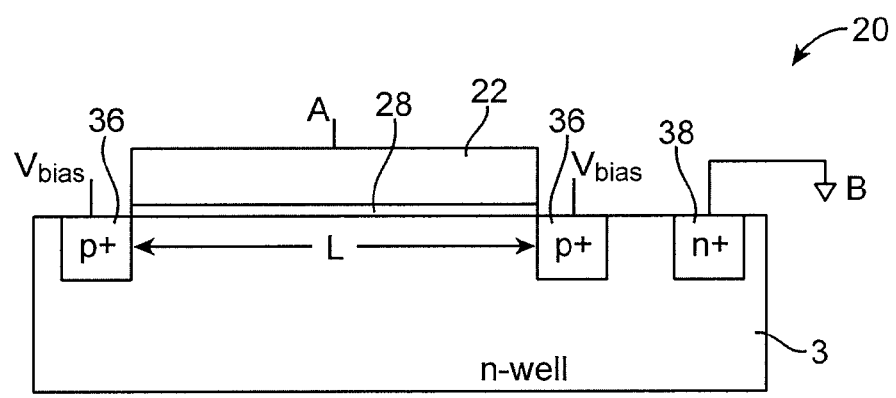

Cross-sectional views of a varactor with a mixed gate structure are shown in FIGS. 2A and 2B. As shown in FIG. 2A, varactor 20 may have a gate structure 22 that has gate conductors formed from two or more gate materials. In the example of FIG. 2A, gate structure 22 has a first gate conductor portion 24 and a second gate conductor portion 26. First gate conductor portion 24 and second gate conductor portion 26 may be formed from different conductive materials having different respective work functions. The conductive materials for gate portions 24 and 26 may be, for example, elemental metals or metal alloys such as aluminum, tungsten, etc.

The conductive materials of gate structure 22 may be formed on top of gate insulator 28. Gate insulator 28 may be formed from silicon oxide or other suitable materials. If desired, gate insulator 28 may be formed from high-K dielectric materials (i.e., dielectrics such as hafnium silicate, hafnium dioxide, zirconium silicate, and zirconium dioxide that have a higher dielectric constant K than silicon dioxide). Typical thicknesses for gate structures such as gate conductor structure 22 are on the order of a thousand angstroms to several thousand angstroms. Typical gate insulator thicknesses are on the order of 40 angstroms (as an example). Larger or smaller film thicknesses may be used if desired.

Because the work functions of the first and second gate portions are different, gate conductor portions such as portions 24 and 26 give rise to different CV curve contributions for varactor 20. In particular, the first and second gate portions are associated with CV curves that are shifted with respect to each other by a voltage difference that correlates with the difference in work functions between the first and second gate portions. When combined in parallel in varactor 20, gate portions 24 and 26 produce an overall CV curve for varactor 20 is less steep than the individual CV curve contributions from the first and second gate portions taken in isolation.

As shown in the cross-section of FIG. 2A, additional conductive materials such as conductive layer 30 may be included in gate structure 22. Conductive layers such as layer 30 bridge underlying gate conductor portions 24 and 26 and thereby help to short portions 24 and 26 together. Conductive layer 30 may be formed from metal, doped polysilicon, or any other suitable materials. For example, conductive layer 30 may be formed from a layer of doped and silicided polysilicon or other conductive material.

In a finished integrated circuit, layer 30 may help form a good electrical contact between gate portions 24 and 26 and interconnects on the integrated circuit. A first capacitor terminal ("terminal A") may be associated with gate structure 22. A second capacitor terminal ("terminal B" of FIG. 2B) may be formed by making an ohmic "body" contact to semiconductor body region 34. A control terminal for varactor 20 that receives voltage Vbias may be formed from source and drain regions (collectively "source-drain regions") in semiconductor region 34. The source-drain regions are shown as regions 36 in FIG. 2B (which is a cross-sectional view of varactor 20 taken along a direction that is perpendicular to the direction used to depict the cross-section of varactor 20 that is shown in FIG. 2A).

As shown in FIG. 2A, shallow trench isolation structures 32 may surround device 20. Structures 32 may be formed from silicon oxide or other suitable insulators. As shown in FIG. 2B, region 34 may (as an example) be formed from n-type semiconductor (e.g., n-type silicon). Source-drain contacts 36 may be formed from heavily doped regions with a different (opposite) doping type (e.g., p-type regions). Body contact region 38 may be formed by using ion implantation to form a region of heavily doped semiconductor (e.g., heavily doped silicon of the same doping type as region 34) and may form an ohmic contact with n-type body region 34. Body region 34 may be formed in a semiconductor substrate (e.g., a substrate of the opposite doping type to the doping type used for body region 34). Body terminal 38 may form second varactor terminal B. First varactor terminal A may be formed by conductive gate structure 22. The control terminal for varactor 20 may be formed by a Vbias interconnect that shorts source region 36 to drain region 36 (FIG. 2B). This interconnect may be formed from metal or other suitable conductive materials.

To facilitate fabrication, it may be desirable to form gate members 24 and 26 along the wider of the two lateral dimensions of body portion 34. This type of arrangement may help to minimize the difficulties associated with aligning photolithographic masks for portions 24 and 26 during fabrication.

The wider of the two lateral gate dimensions in MOS-type structures is generally referred to as the gate width. The width W of varactor 20 is shown in FIG. 2A. The semiconductor gate of varactor 20 also has an associated length L. The length L extends in the lateral dimension perpendicular to width W (i.e., into the page of FIG. 2A). Length L of varactor 20 is shown in the cross-sectional diagram of FIG. 2B.

If desired, the length L and the width W of the gate in varactor 20 may be of the same magnitude. More typically, width W will be longer than length L. The magnitude of width W may be, for example, larger than one half of a micron, larger than one micron, etc. Length L may be on the order of a fraction of a micron. For example, length L may be the minimum dimension permitted by the design rules for the semiconductor fabrication process that is being used to fabricate varactor 20 (e.g., 32 nm). Length L may, in general, be less than a micron in magnitude, may be more than a micron in magnitude, etc.

Figure 3:
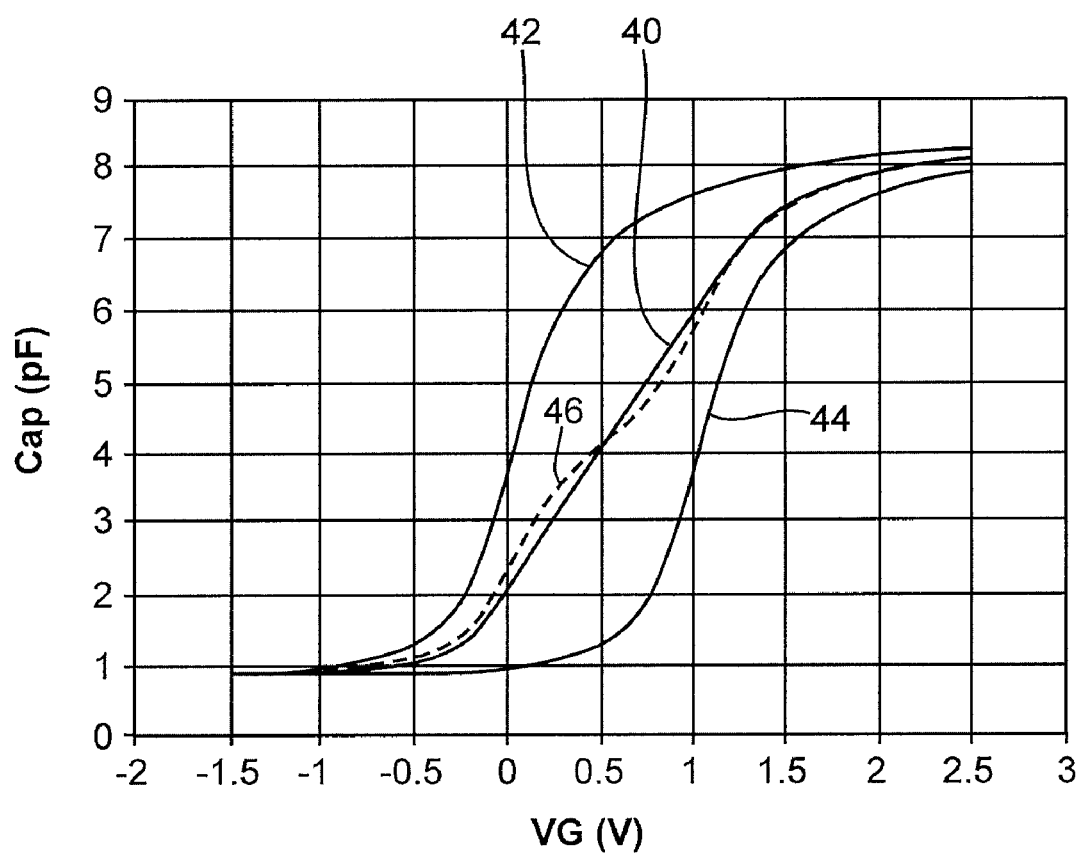
FIG. 3 is a graph comparing the performance of a varactor of the type shown in FIGS. 2A and 2B to other varactor structures in accordance with an embodiment of the present invention.

FIG. 3 shows simulation results comparing the performance of a mixed gate varactor to conventional structures. Trace 40 of the CV graph of FIG. 3 shows the performance of a varactor of the type shown in FIGS. 2A and 2B. In the graph of FIG. 3, the capacitance of various varactor structures is plotted as a function of applied gate voltage VG. For the scenario plotted in FIG. 3, terminal B and control terminal Vbias of each varactor is held at a ground voltage (e.g., 0 volts), while the voltage of terminal A (VG) is varied. Lines 42 and lines 44 correspond to varactor structures having a single gate metal. Line 42 corresponds to a varactor structure formed from only a single gate metal such as gate portion 24 of FIG. 2A. Line 44 corresponds to a varactor structure formed from a single gate metal such a gate portion 26 of FIG. 2A. The metals of gate portions 24 and 26 have different work functions, which leads to the voltage shift between curves 42 and 44.

In the illustrative example of FIG. 3, the metal used to form gate portion 24 may have a work function similar to that of heavily doped n-type polysilicon, whereas the metal used to form gate portion 26 may have work function similar to that of heavily doped p-type polysilicon. For example, if semiconductor region 34 (FIGS. 2A and 2B) is formed from n-type silicon, metal 24 may have a work function of about 4.2 eV, whereas metal 26 may have a work function of about 5.1 eV (as examples). Other arrangements may also be used such as arrangements in which the metal work functions for the different gate conductor portions differ by different amounts (e.g., by less than 0.3 eV, by 0.3 eV or more, by at least 0.6 eV, by at least 0.9 eV, etc.).

Traces 42 and 44 are typical for conventional A-MOS varactors and tend to exhibit fairly steep slopes. However, when a mixed gate varactor such as varactor 20 of FIGS. 2A and 2B is formed by combining gate portions 24 and 26 into a single gate structure 22, the resulting performance characteristic (CV curve 40) exhibits a substantially decreased slope. This gradual dependence on capacitance with changes in voltage makes mixed gate varactors such as varactor 20 of FIGS. 2A and 2B suitable for circuit applications in which moderate CV slopes are required.

As shown in FIG. 3, the dependence of capacitance on voltage exhibited by trace 40 is also highly linear. The linear behavior and the gradual slope of CV trace 40 improves circuit performance when the mixed gate varactor is used in analog circuits. For example, in voltage-controlled oscillator circuitry, varactors with linear and gradual CV curves help the circuitry exhibit reduce noise, better phase margin, more predictable bandwidth, reduced jitter, etc.

In conventional circuits in which two varactors such as the varactors of traces 42 and 44 are connected in parallel, the resulting circuit will exhibit a non-linear CV response of the type illustrated by dashed line 46. Although the slope of curve 46 is reduced relative to that of curves 42 and 44, the nonlinearity of curve 46 will adversely affect circuit performance.

As indicated by the linear shape of line 40, modeling simulations have shown that mixed gate varactors will exhibit enhanced linearity and gradual CV curve slopes. It is believed that the enhanced linearity is due to carrier diffusion under the varactor gate and the resulting redistribution of the electric fields in semiconductor 32. The enhanced linearity of the mixed gate varactor structure relative to conventional designs may enhance circuit performance when the mixed gate varactors are incorporated into circuits such as voltage-controlled oscillators, phase-locked loops, filters, etc.

An illustrative process flow that may be used in fabricating mixed gate varactors is shown in FIGS. 4-11. In the partially formed mixed gate varactor structure 20 of FIG. 4, gate oxide layer 28 (GOX) has been formed on silicon region 34. Shallow trench isolation (STI) structures 32 have been formed adjacent to gate oxide 28. (Although referred to in connection with FIG. 4 and elsewhere as "gate oxide," any suitable insulating material may be used to form layer 28. For example, a high-K dielectric material may be used to form gate insulating layer 28. The high-K material may or may not contain oxygen.

A sacrificial polysilicon gate layer 46 is patterned on top of gate insulator 28 between spacers 52. An etch stop layer 48 such as a layer of silicon oxynitride (SiON) is deposited on top of sacrificial polysilicon layer 46. A silicon dioxide layer such as layer 50 may then be deposited over etch stop layer 48.

As shown in FIG. 5, chemical mechanical polishing (CMP) techniques may be used to polish the wafer containing the partially formed varactor structures of FIG. 4, leaving exposed upper polysilicon surface 54.

After polysilicon layer 54 has been exposed by the polishing operations of FIG. 5, sacrificial polysilicon layer 54 may be removed using a polysilicon etch process, leaving the structure of FIG. 6. Etch stop layer 48 may protect underlying structure such as spacers 52.

Following polysilicon removal, a layer of metal for first metal gate 24 may be deposited, as shown in FIG. 7.

Following polishing (e.g., using chemical mechanical polishing techniques), photoresist layer 56 may be deposited and photolithographically patterned on top of the metal layer 24, as shown in FIG. 8.

Etching may then be used to remove the undesired portion of metal gate portion 24, as shown in FIG. 9. After etching is complete, photoresist 56 may be removed.

As shown in FIG. 10, a layer of metal for second metal gate 26 may be deposited on top of the opening formed in the etching operations of FIG. 9. Following polishing, the mixed gate varactor structure appears as shown in FIG. 11. As shown in FIG. 11, gate structure 22 of varactor 20 has first and second gate conductors 24 and 26 formed from metals or other conductive materials having two different work functions. The gate conductors are arranged at different lateral locations along the surface of gate insulating layer 28 and are electrically connected at interface 58. As described in connection with FIG. 2A, one or more additional conductive layers such as conductive gate layer 30 may be deposited on top of gate conductors 24 and 26. Structures such as the source and drain contacts 36 and body contact 38 may also be formed (e.g., using ion implantation and other conventional processes before performing the fabrication operations of FIG. 4), so that the gate structure forms a first varactor (capacitor) terminal, the body forms a second varactor (capacitor) terminal, and the source and drain are shorted together and form a bias terminal for the varactor.

Another illustrative semiconductor fabrication process for forming a mixed gate varactor is shown in FIGS. 12-15. With the approach of FIGS. 12-15, source-drain regions 36 and body region 38 (FIG. 2B) are formed after gate structure 22, rather than before.

Figure 12:
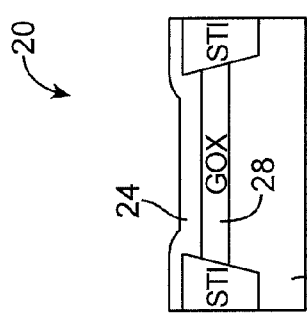

As shown in FIG. 12, gate insulating layer 28 may be formed on semiconductor 34. A layer of metal or other conductor for forming first gate conductor 24 may be deposited on gate insulating layer 28.

Figure 13:
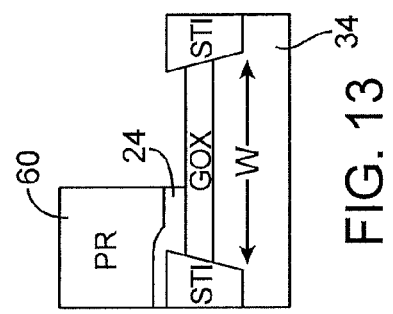

Using photolithography, photoresist layer 60 may be patterned over layer 24. When patterned as shown in FIG. 13, a first half of layer 24 along gate width W is protected by photoresist 60 and a second half of layer 24 is exposed. During etching, the exposed portion of layer 24 is removed, producing the structure of FIG. 13. Photoresist layer 60 of FIG. 13 may be removed before subsequent processing.

Figure 14:
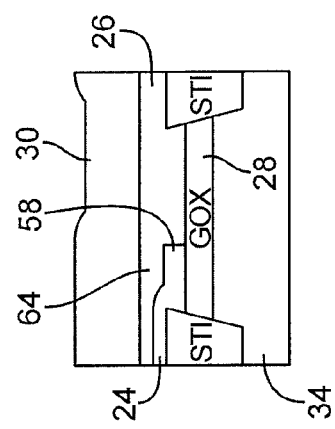

A layer of metal or other conductor for forming second gate conductor 26 may then be deposited on gate oxide layer 28 and gate layer 24. As with the structure of FIG. 11, this process forms an interface 58 between laterally spaced gate layers 24 and 26 (FIG. 14). In addition, a portion 64 of layer 24 may be covered with overlapping material from layer 26. As shown in FIG. 14, gate conductors 24 and 26 may be covered with a layer of conductive material 30 such as polysilicon by depositing layer 30 on top of the portion of layer 26 that lies directly on gate insulator 28 (i.e., gate conductor portion 26 of FIG. 2A) and by depositing layer 30 on top of portion 64 of layer 26, which lies above gate conductor portion 24.

Figure 15:
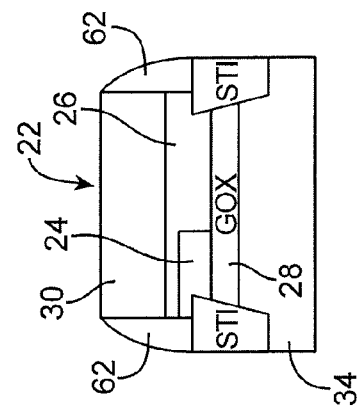
FIGS. 12, 13, 14, and 15 are cross-sectional diagrams of another illustrative method for forming a varactor of the type shown in FIGS. 2A and 2B in accordance with an embodiment of the present invention.

Photolithographic techniques may be used to pattern polysilicon layer 30, thereby forming gate structure 22 (FIG. 15). As shown in FIG. 15, dielectric spacers such as silicon oxide spacers 62 may be formed on patterned polysilicon layer 30. During subsequent ion implantation steps, heavily doped varactor regions such as regions 36 and 38 of FIG. 2B may be formed.

Figure 16:
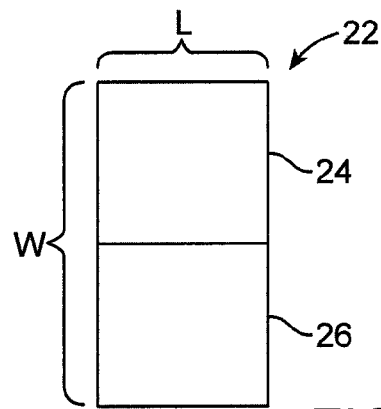
FIG. 16 is a top view of a gate structure in an illustrative varactor in accordance with an embodiment of the present invention.

If desired, gate structure 22 may be formed using an arrangement of the type shown in the top view of FIG. 16. With this type of arrangement, gate conductors 24 and 26 are laterally spaced along the larger lateral gate dimension (width W) of varactor 22, rather than along its smaller lateral dimension (length L). The gate structure 22 may be fabricated with a length L and width W of any suitable ratio. For example, the ratio of width W to length L may be 1:1 or more, 2:1 or more, 3:1 or more, 5:1 or more, 10:1 or more, etc.

Figure 17:
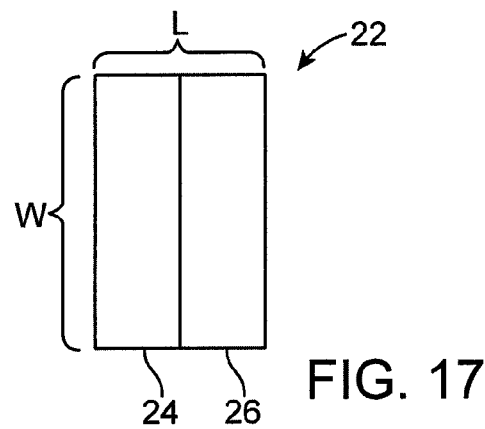
FIGS. 17, 18, and 19 are top views of additional gate structures in accordance with embodiment of the present invention.

FIG. 17 shows how the different gates in the gate structure 22 of a mixed gate varactor may be alternate along the shorter dimension (length L) of the gate.

If desired, there may be more than two different gates such as gate metals 24 and 26 in a given gate structure 22. For example, there may be three gate conductors or more, four gate conductors or more, five or more gate conductors, etc. There may be two or more different materials associated with these gate conductors. For example, in a gate structure 22 with four interconnected gates, there may be two different types of gate metals, three different types of gate metals, four different types of gate metals, etc. Each different gate metal (or other material) may have a different associated work function.

Figure 18:
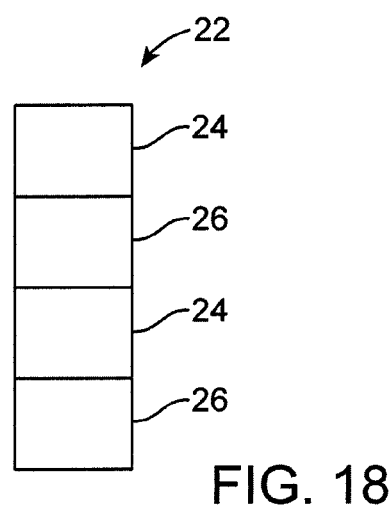

FIG. 18 shows how gate structure 22 may have four alternating gate conductors. In the FIG. 18 example, there are only two different types of gate conductor. A first type (gates 24) is formed from a first metal having a first work function and a second type (gates 26) is formed from a second metal having a second work function.

Figure 19:
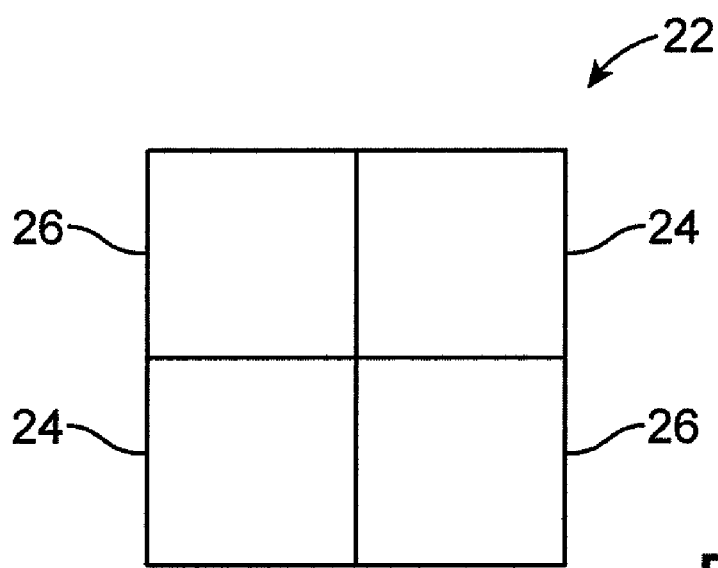

If desired, different patterns may be used in forming the gate conductors for gate structure 22. FIG. 19 shows an illustrative layout in which gate conductors 24 and 26 alternate in a checkerboard pattern. Combinations of the arrangements of FIGS. 16, 17, 18, and 19 and other suitable arrangements may also be used.

Figure 20:
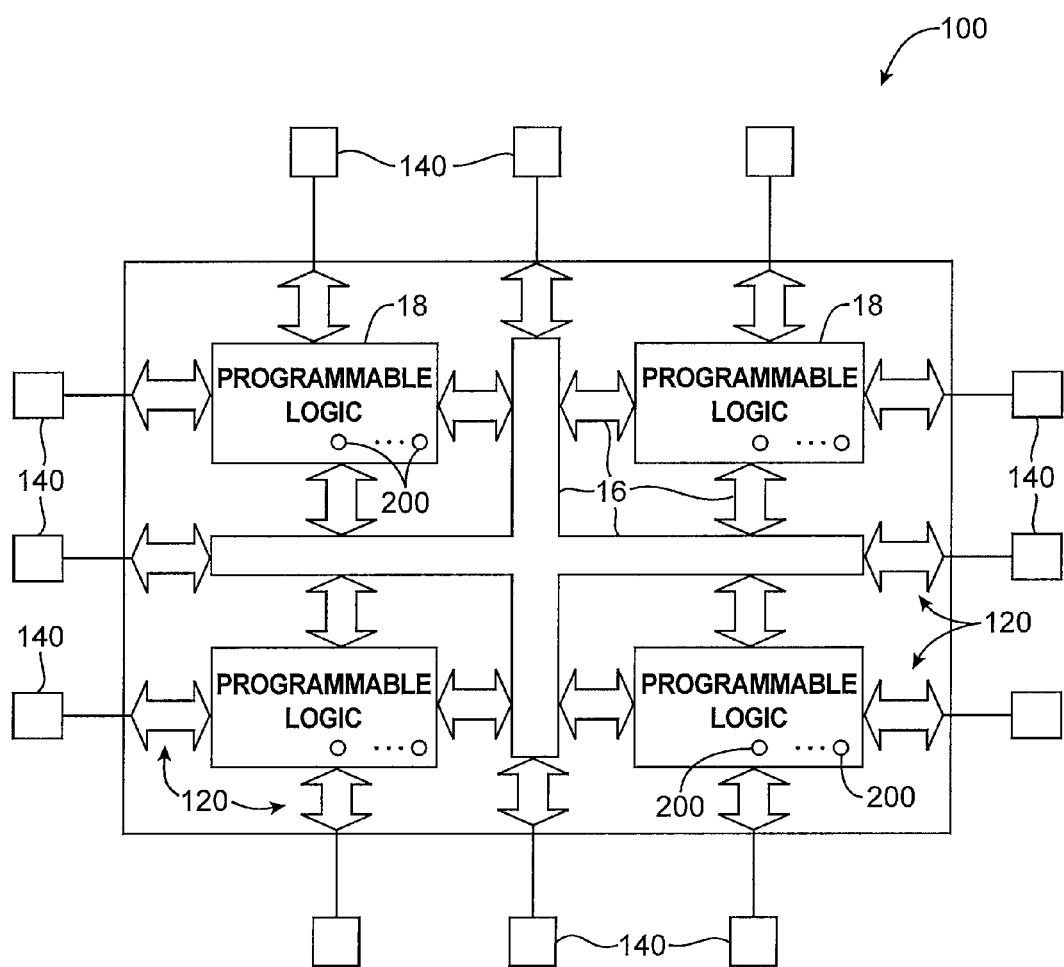
FIG. 20 is a diagram of an illustrative integrated circuit such as a programmable integrated circuit in which mixed gate varactors of the type shown in FIGS. 2A and 2B may be used in accordance with an embodiment of the present invention.

FIG. 20 is a diagram of an illustrative integrated circuit such as a programmable integrated circuit in which mixed gate varactors of the type shown in FIGS. 2A and 2B may be used in accordance with an embodiment of the present invention. Integrated circuit 100 of FIG. 20 may be, for example, a programmable logic device integrated circuit. Programmable logic devices are integrated circuits that can be configured by a user to perform custom logic functions. Electrically-programmed programmable logic devices are configured ("programmed") by loading configuration data into the device. The configuration data selectively turns on and off components of the device's circuitry and thereby customizes the logic on the device. Mask-programmed programmable logic devices are similar to electrically-programmed programmable logic devices, but are customized using customized lithographic masks based on the configuration data rather than by electrically loading the configuration data into the device.

As shown in FIG. 20, input/output circuitry 120 may be provided for driving signals off of device 100 and for receiving signals from other devices via input/output pins 140. Pins 140 may be any suitable types of pins or solder bumps for making electrical connections between the internal circuitry of device 100 and external packaging. Some of the pins 140 may be used for high-speed communications signals, other pins may be used to provide power supply voltages to the device 100 or may be used for DC or low-frequency signals.

Interconnection resources 16 such as global and local vertical and horizontal conductive lines and buses may be used to route signals on device 100. The remainder of the circuitry 18 on device 100 includes blocks of programmable logic, memory blocks, regions of digital signal processing circuitry, processors, etc. The programmable logic in circuitry 18 may include combinational and sequential logic circuitry including logic gates, multiplexers, switches, look-up-tables, logic arrays, etc. These illustrative components are not mutually exclusive. For example, look-up tables and other components that include logic gates and switching circuitry can be formed using multiplexers.

Some of the logic of programmable logic device 100 is fixed (hardwired). The programmable logic in device 100 includes components that may be configured so that device 100 performs a desired custom logic function. The programmable logic in programmable logic device 100 may be based on any suitable programmable technology. With one suitable approach, configuration data (also called programming data) may be loaded into programmable elements in the programmable logic device 100 using pins 140 and input/output circuitry 120. During normal operation of device 100, the programmable elements (also sometimes called configuration bits or programmable function control elements) each provide a static control output signal that controls the state of an associated logic component in the programmable logic of circuitry 18.

In a typical arrangement, the programmable elements may be random-access memory (RAM) cells that are loaded from an external chip via certain pins 140 and appropriate portions of input/output circuitry 120. The loaded RAM cells provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 100. Circuit elements in input/output circuitry 120 and interconnection resources 16 are also generally configured by the RAM cell outputs as part of the programming process (e.g., to customize I/O and routing functions). The circuit elements that are configured in input/output circuitry 120, interconnection resources 16, and circuitry 18 may be pass transistors, parts of multiplexers, look-up tables, logic arrays, AND, OR, NAND, and NOR logic gates, etc.

RAM-based programmable logic device technology is merely one illustrative example of the type of technology that may be used to implement programmable logic device 100. Other suitable programmable logic device technologies that may be used for device 100 include one-time programmable device arrangements such as those based on programmable logic elements made from fuses or antifuses (laser blown or electrically configured), programmable logic devices in which elements 200 are formed from electrically-programmable read-only-memory (EPROM) or erasable-electrically-programmable read-only-memory (EEPROM) technology, or programmable logic devices with programmable elements made from magnetic storage elements, etc. Illustrative programmable logic elements are shown schematically as elements 200 in FIG. 20.

The circuitry of device 100 may also be formed in a regular pattern that makes it amenable to rapid mask programming using special lithographic masks. With one suitable mask-programming arrangement, a customized mask that defines a layer of custom vias is used to program programmable logic device 100. The via hole locations on the mask may be defined using configuration data produced by a programmable logic device design tool.

Regardless of the particular type of programmable element arrangement that is used for device 100, programmable elements 200 are preferably provided with configuration data by a user (e.g., a logic designer). Once provided with configuration data, the programmable elements selectively control (e.g., turn on and off) portions of the circuitry in the programmable logic device 100 and thereby customize its functions so that it will operate as desired.

The circuitry of device 100 may be organized using any suitable architecture. As an example, the logic of programmable logic device 100 may be organized in a series of rows and columns of larger programmable logic regions or areas each of which contains multiple smaller logic regions or areas. The larger programmable logic regions are sometimes referred to as logic array blocks (LABs). The smaller logic regions that are contained within the logic array blocks are sometimes referred to as logic elements. A typical logic element contains a look-up table and associated multiplexer circuitry.

These logic resources may be interconnected by interconnection resources 16 such as associated vertical and horizontal interconnection conductors. Interconnection conductors may include global conductive lines that span substantially all of device 100, fractional lines such as half-lines or quarter lines that span part of device 100, staggered lines of a particular length (e.g., sufficient to interconnect several logic areas), smaller local lines that interconnect small logic regions in a given portion of device 100, or any other suitable interconnection resource arrangement. If desired, the logic of device 100 may be arranged in more hierarchical levels or layers in which multiple large areas are interconnected to form still larger portions of logic. Still other device arrangements may use logic that is not arranged in rows and columns. Portions of device 100 (e.g., in input/output circuitry 120 and elsewhere) may be hardwired for efficiency.

Mixed gate varactors may be used in integrated circuits such as application-specific integrated circuits, digital signal processors, memory circuits, microprocessors, analog circuits (e.g., radio-frequency analog circuits), digital circuits, programmable devices that contain registers or other configurable elements that are not typically referred to as programmable logic devices, or programmable logic devices such as programmable logic device 100 of FIG. 20. These are merely illustrative examples. Mixed gate varactors may, if desired, be implemented on any suitable integrated circuit.

Figure 21:
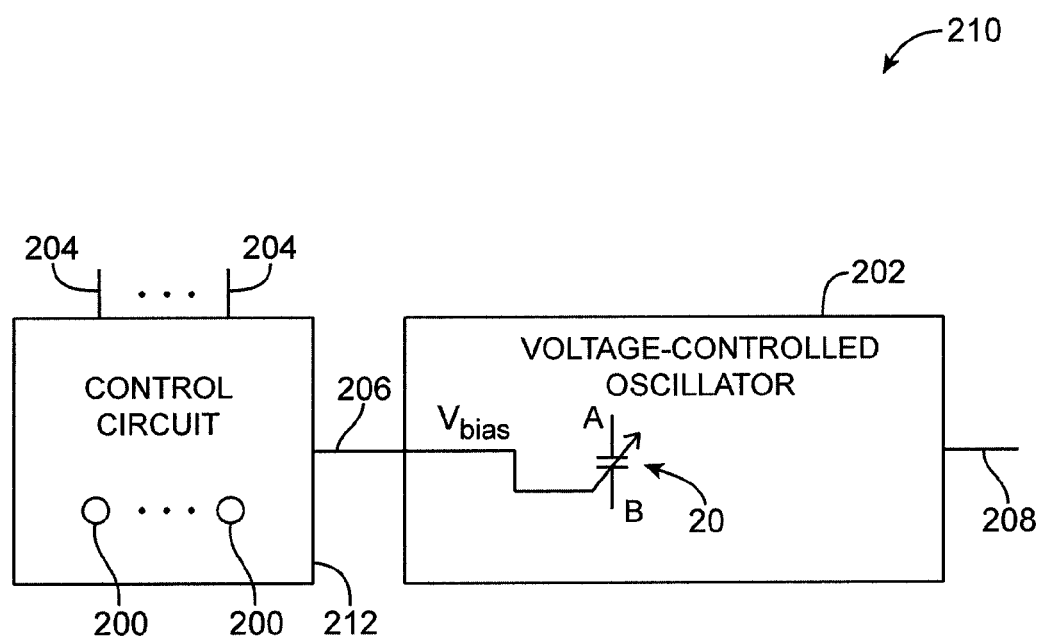
FIG. 21 is a diagram illustrating how circuitry such as voltage-controlled oscillator circuitry may be provided with mixed gate varactors in accordance with an embodiment of the present invention.

An illustrative circuit 210 of the type that may benefit from the enhanced electrical characteristics of mixed gate varactors such as varactor 20 of FIGS. 2A and 2B is shown in FIG. 21. In the example of FIG. 21, circuit 210 includes circuitry such as voltage-controlled oscillator circuitry 202 in which voltage controlled frequency tuning operations are performed by adjusting the magnitude of varactor control signal Vbias for mixed gate varactor 20. This adjusts the capacitance across terminals A and B of mixed gate varactor 20 and causes voltage-controlled oscillator 202 to adjust the frequency of the output signal supplied on output 208. If desired, mixed gate varactors may be used in other types of circuits (e.g., filters, etc.). The use of mixed gate varactor 20 in voltage controlled oscillator circuitry in the example of FIG. 21 is merely illustrative.

As shown in FIG. 21, control signals for voltage-controlled oscillator 202 may be supplied to mixed gate varactor 20 via input path 206. Control circuitry such as control circuit 212 may provide an analog control signal Vbias on control signal path 206. Control circuit 212 may use feedback from output 208 in producing the signal Vbias on path 206. Control circuit 212 may also generate the control signal on path 206 based on input received on input paths 204 and based on the values of static output signals produced by programmable elements 200.

Because the CV curve exhibited by mixed gate varactor 20 can be gradual and highly linear (as shown by trace 40 of FIG. 3), the performance of circuitry 210 can be improved. In particular, when the mixed gate varactor is used in analog circuits such as voltage-controlled oscillator 202, the linear and gradual CV curve characteristics of the mixed gate varactor help the circuitry exhibit reduce noise, better phase margin, more predictable bandwidth, reduced jitter, etc.

The foregoing is merely illustrative of the principles of this invention and various modifications can be made by those skilled in the art without departing from the scope and spirit of the invention.

What is claimed is:

1. A mixed gate metal-oxide-semiconductor varactor comprising:
   a semiconductor region;
   a gate insulator formed on the semiconductor region; and
   at least first and second gate conductors that are formed on the gate insulator and are in contact with each other, wherein the first and second gate conductors form part of a gate structure, wherein the gate structure further comprises a layer of polysilicon formed on the first and second gate conductors that electrically couples the first and second gate conductors, and wherein the first and second gate conductors have different work functions, respectively.

2. The mixed gate varactor defined in claim 1 wherein the first and second gate conductors comprise metal.

3. The mixed gate varactor defined in claim 1 wherein the first gate conductor comprises a first metal and wherein the second gate conductor comprises a second metal that is different than the first metal.

4. The mixed gate varactor defined in claim 1 further comprising at least a third gate conductor on the gate insulator.

5. The mixed gate varactor defined in claim 1 further comprising heavily doped regions in the semiconductor region that form a bias terminal for controlling capacitance for the mixed gate varactor.

6. The mixed gate varactor defined in claim 5 wherein the semiconductor region has a given doping type, wherein the heavily doped regions in the semiconductor region that form the bias terminal have a different doping type than the given doping type, wherein the mixed gate varactor further comprises a body contact region that is heavily doped with the given doping type, wherein the gate conductor structure forms a first capacitor terminal for the mixed gate varactor, wherein the body contact region forms a second capacitor terminal for the mixed gate varactor, and wherein the capacitance that is controlled by the bias terminal is provided across the first and second terminals.

7. The mixed gate varactor defined in claim 1 wherein at least part of the second gate conductor overlaps the first gate conductor.

8. The mixed gate varactor defined in claim 1 wherein the gate insulator is a dielectric comprising hafnium.

9. The mixed gate varactor defined in claim 1 wherein the gate insulator comprises a dielectric having a dielectric constant greater than silicon oxide.

10. The mixed gate varactor defined in claim 9 wherein the first gate conductor comprises a first metal, wherein the second gate conductor comprises a second metal, and wherein the first and second metals have different work functions.

11. The mixed gate varactor defined in claim 1 further comprising an input connected to the semiconductor region operable to receive a signal that is produced by a control circuit based on configuration data loaded into a programmable element.

12. A varactor having a capacitance, comprising:
    a semiconductor having a given doping type;
    a first terminal that is coupled to the semiconductor by a doped region having the same doping type as the given doping type, wherein the first terminal is operable to receive a first voltage;
    a second terminal that is coupled to the semiconductor by a doped region having a different doping type than the given doping type, wherein the second terminal is operable to receive a second voltage that is adjustable and that is different than the first voltage, and wherein the second voltage is operable to be controlled for adjusting the capacitance of the varactor;
    a gate insulating layer on the semiconductor; and
    a gate structure on the gate insulating layer that has a length and a width that is greater than the length and that forms a third terminal for the varactor, wherein the gate structure comprises a first gate conductor having a first work function and a second gate conductor having second work function that is different than the first work function, wherein the first and second work functions of the first and second gate conductors contribute to the capacitance of the varactor, and wherein the first and second gate conductors are arranged in alternation along the width of the gate structure on a surface of the gate insulating layer.

13. The varactor defined in claim 12 further comprising at least a third gate conductor on the gate insulating layer that is adjacent to the second gate conductor and that has a different work function from the second gate conductor.

14. Variable capacitor circuitry having a capacitance, comprising:
    a semiconductor having a given doping type;
    a first terminal that is connected to the semiconductor by a doped region having the same doping type as the given doping type, wherein the first terminal is operable to receive a first voltage;
    a second terminal that is connected to the semiconductor by a doped region having a different doping type than the given doping type, wherein the second terminal is operable to receive a second voltage that is different than the first voltage;
    a gate insulating layer on the semiconductor; and
    a gate structure on the gate insulating layer that forms a third terminal for the variable capacitor circuitry, wherein the gate structure comprises a first gate metal on the gate insulating layer, and a second gate metal on the gate insulating layer, wherein the second gate metal has a different work function than the first gate metal, wherein the work function of the first gate metal and the work function of the second gate metal contribute to the capacitance of the variable capacitor circuitry, wherein the gate structure has a length and a width that is greater than the length, and wherein the first gate metal and the second gate metal are arranged in alternation along the width of the gate structure.

15. The variable capacitor circuitry defined in claim 14 wherein silicon dioxide has a dielectric constant and wherein the gate insulating layer comprises a dielectric having a dielectric constant greater than the silicon dioxide dielectric constant.

16. The variable capacitor circuitry defined in claim 15 wherein the gate structure comprises a polysilicon layer that is electrically coupled to at least the first gate metal.

17. The variable capacitor circuitry defined in claim 14, further comprising:

a ground power supply line operable to supply the first voltage; and a control circuit, wherein the control circuit has an output coupled to the second terminal and wherein the first terminal is coupled to the ground power supply line.

18. The variable capacitor circuitry defined in claim 17, further comprising:

a plurality of programmable elements, wherein the plurality of programmable elements are operable to provide static control signals to the control circuit to adjust the second voltage.

* * * * *